United States Patent [19]

Ciccarelli, Jr. et al.

[11] Patent Number: 5,553,633
[45] Date of Patent: Sep. 10, 1996

[54] APPARATUS FOR TREATMENT OF PRINTED CIRCUIT BOARDS AND THE LIKE

[75] Inventors: Paul W. Ciccarelli, Jr., Huntingdon; Charles Seager, Jr., Alexandria; Ricky Himes, Boalsburg, all of Pa.

[73] Assignee: Atotech USA, Inc., State College, Pa.

[21] Appl. No.: 551,067

[22] Filed: Oct. 31, 1995

Related U.S. Application Data

[62] Division of Ser. No. 199,563, Feb. 22, 1994, Pat. No. 5,494,529.

[51] Int. Cl.$^6$ ............................................ B08B 3/02
[52] U.S. Cl. .................. 134/72; 34/662; 134/127; 134/129; 134/131; 134/902
[58] Field of Search .................. 134/9, 15, 23, 134/25.2, 25.4, 26, 30, 32, 37, 72, 127, 902, 129, 131; 15/302, 309.2; 34/461, 460, 618, 619, 620, 659, 662; 239/225.1, 587.5

[56] References Cited

U.S. PATENT DOCUMENTS

| | | | |
|---|---|---|---|
| 3,442,708 | 5/1969 | Huddle | 134/32 |
| 4,015,706 | 4/1977 | Goffredo et al. | 198/780 |
| 4,017,982 | 4/1977 | Goffredo | 34/31 |
| 4,092,991 | 6/1978 | Rohrs | 134/127 |
| 4,327,756 | 5/1982 | Rath | 134/72 |
| 4,561,904 | 12/1985 | Eberhardt, Jr. | 134/18 |
| 4,589,926 | 5/1986 | Holmstrand | 134/6 |
| 5,012,547 | 5/1991 | Marsh | 15/304 |

FOREIGN PATENT DOCUMENTS

| | | | |
|---|---|---|---|
| 236883 | 7/1945 | Switzerland | 239/587.5 |
| 1361617 | 7/1974 | United Kingdom | 34/620 |

*Primary Examiner*—Philip R. Coe
*Attorney, Agent, or Firm*—Paul & Paul

[57] ABSTRACT

Apparatus for treating printed circuit boards or other items is provided, wherein a drying apparatus is specifically provided, generally for use as part of a cleaning or other treatment apparatus, but which can be separately provided, if desired. The drying apparatus employs preferably warm air discharge tubes, for drying items of varying thicknesses, and/or that have varying thicknesses of components mounted thereon. Generally, the printed circuit or other items are carried through the apparatus between upper and lower foraminous conveyor belts, with one of the belts, conforming to the varying thicknesses of the items, or components carried by the items. While some of the air discharge tubes may be stationarily mounted, at least some of them are pivotally mounted, such that their discharge opening zones can slide along and conform to variations in thickness. The discharge tube will pivot in response to the varying thicknesses. The pivotal motion of the tube may be provided with a means for balancing the same.

16 Claims, 2 Drawing Sheets

APPARATUS FOR TREATMENT OF PRINTED CIRCUIT BOARDS AND THE LIKE

CROSS-REFERENCE TO RELATED APPLICATION

This is a division of U.S. application Ser. No. 08/199,563, filed Feb. 22, 1994, and now U.S. Pat. No. 5,494,529.

BACKGROUND OF THE INVENTION

In the field of wet processing, particularly that of treatment of printed circuit boards and industrial parts, the boards are often treated by wave soldering, etching, cleaning or the like, followed by various other treatments, generally including as a minimum, rinsing and drying. Similarly, in other types of treatments, such as electroplating or the like, the articles or items being plated are likewise followed by subsequent treatment steps, such as rinsing, drying and the like.

Frequently, the items being treated, whatever the form a treatment may take, will need to at least be rinsed and then dried, before subsequent processing or use can take place.

Often, the articles being treated have various thicknesses, such that the liquid treatment, such as rinsing or the like, and subsequent drying, must accommodate those various thicknesses of the articles being treated.

In some processing situations, such as when the printed circuit boards already have electronic components mounted on them, which electronic components are of various sizes and configurations, including, for example, resistors, capacitors, chips, transistors, plug-connectors, etc., such components themselves are of various thicknesses, such that when they are mounted on a printed circuit board, various portions of the boards with the components applied to them therefore assume various thicknesses within a given board. Similarly, from board-to-board, there can be considerable variation in thicknesses, because of variations in thicknesses of different components that appear on different ones of the boards.

Generally, such component-mounted boards undergo a treatment in the form of soldering, often of the wave soldering type, in which a large number of electrical connections of components on the boards are simultaneously soldered together.

It is most often necessary that following such a soldering operation, the boards need to be cleaned, generally by being rinsed and then dried, for removal of soldering flux, or of any other undesired substances from the boards.

Similarly, where other types of treatment are involved for boards, with or without electronic components on them, which treatments can take the form of etching, electroplating or the like, it is necessary to remove residues of the treatment process in a cleaning operation. Such cleaning operations will likewise involve rinsing, generally by means of a water rinse, followed by a drying operation.

Drying operations for following other rinsing or other operations are known in the art. Reference is made, for example, to the drying method and apparatus disclosed in U.S. Pat. No. 4,017,982, the complete disclosure of which is herein incorporated by reference. Such drying apparatus often involves the use of air knives that are fixedly mounted. It is, however, known in the art that often one of a pair of opposed air knives, often generally the upper air knife; namely that being disposed above the path of travel of printed circuit boards or other articles passing therebeneath, may be mounted, such that the ends of the air knife are carried by the apparatus in vertical slots, such that some raising of the air knife is facilitated when thicker articles are to be carried therepast. Also, it is noted that in some situations the mountings for an air knife at opposite ends, where they are carried by the apparatus, may be released, as being unbolted, with some tilting, pivoting or other modification or adjustment in the orientation of the air knife effected, followed by a re-bolting or affixing of the air knife back into a fixed position.

THE PRESENT INVENTION

The present invention is directed to allowing an automatic adjustment in position of an air knife for accomplishing a drying operation by allowing an automatic rotational or pivotal movement of an air knife to accommodate variations in thicknesses of given portions of a printed circuit board or other item being carried therepast, as well as to accommodate variations in thicknesses of different printed boards or items carried therepast.

In a preferred arrangement, the articles being treated are carried generally horizontally disposed, along a generally horizontal path of travel, preferably on a continuous foraminous conveyor, with another preferably continuous, foraminous conveyor disposed against upper surfaces of the belts, with the articles thereby being "sandwiched" between the preferably belt-type conveyors or conveyor rods, as for example rods like those disclosed in U.S. Pat. No. 4,015,706, the complete disclosure of which is herein incorporated by reference (with rods for the upper conveyor preferably being slot-mounted to enable the upper conveyor to rise with increased thickness of items being treated), with the upper conveyor serving as a hold-down or keeper conveyor. The adjustable air knife is then allowed to "follow" the keeper conveyor, which will normally have variations in height to accommodate variations in thickness of different items or different portions of items being conveyed through the apparatus. These variations in height or thicknesses will be detected by the portion of the air knife that "follows" the keeper conveyor, with the result that the air knife, which is generally carried by an air tube, will rotate or pivot an amount responsive to the variation in thickness such that the discharge end of the air knife will move away from the lower, conveyor belt as thicker items pass beneath the air knife, and will return closer to the lower belt as thinner items are conveyed therepast, thereby automatically effecting an adjustment in position for the air knife.

The present invention thus facilitates the drying of the boards or other items, particularly when the dryness of the same is critical. Such is often the case where the articles being treated are printed circuit boards involving pin connections or other deep-closed pocket-type connections which are inherently very difficult to dry. With the present invention, the air knife can be automatically positioned as close as possible to the connector or other component on the printed circuit board, particularly because of the ability of the discharge portion of the air knife to "follow" the keeper conveyor, preferably by sliding there-along.

Thus, the present invention does not require shutting down a drying operation and effecting a fixed adjustment of position of an air knife, to raise or lower the same, to accommodate a particular circuit board of a number of printed circuit boards or other items being treated, in that the adjustment provided herewith is automatically effected.

The adjustment is effected by pivotally or rotationally rotating the tube carrying the air knife, which changes the position of the air knife, insofar as its direction of high velocity air discharged therefrom is provided. This directed air flow and changes in flow direction facilitate the removal of moisture and drying of the moisture that may be present in pin hole connections or at other locations on printed circuit boards or other items being treated.

In order to facilitate the pivoting or rotation of the air tube that carries the air knife, at least one end of the air tube is preferably bearing-mounted for ease of rotation. The tube is also designed to be self-balancing in that the force of the air discharge is balanced against the moment created by the off-center location of the weight.

Additionally, or instead, counterweights and/or springs may be provided for facilitating the balancing. The result is that, under all operating conditions the air discharge tube's trailing edge, from which emanates the air, will remain in contact with the keeper belt, preferably the upper conveyor belt, with such trailing edge preferably being provided with a low friction sliding surface for facilitating the sliding of the same along the keeper belt.

SUMMARY OF THE INVENTION

The present invention is directed toward the drying of items that are delivered on a generally foraminous conveyor belt passing thereby, with such items preferably being printed circuit boards of varying thicknesses, with or without electronic components mounted thereon. The drying is facilitated by pivotally or rotationally mounting the drying tubes from which air emanates, such that the air discharge zones of the tubes may follow along a "keeper" conveyor which generally conforms locally, in a vertical position, to the thickness of articles being conveyed through the apparatus, such that variations in thickness will be sensed by the trailing edge of the air tube, and cause the air tube to pivot or rotate, to stay close to the keeper conveyor through which it blows air at the items being dried, as well as to change the direction of air emanating from the air knife. The pivotal air tube may be bearing-mounted, for ease of rotation, and may have anti-friction means at its trailing end to facilitate sliding over the keeper conveyor.

Accordingly, it is a primary object of this invention to provide a novel treatment apparatus including air drying.

It is a further object of this invention to accomplish the above object, wherein the drying is effected by pivotally or rotationally mounting an air tube, such that a discharge portion of the air tube, such as an air knife, for example, may trail a keeper conveyor, and conform in its position to various thicknesses of articles being carried on the keeper conveyor, by means of rotation of the air tube about its axis.

It is another object of this invention to provide novel method and apparatus for drying items, with or without other treatments.

It will be apparent from the foregoing that other objects will be accomplished by the present invention, all within the spirit and scope of the invention as defined by the appended claims.

BRIEF DESCRIPTIONS OF THE DRAWING FIGURES IN THE DRAWINGS

FIG. 1 is a longitudinal sectional view, in schematic format, showing a processing or treatment method and apparatus, whereby various liquid treatments are followed by the drying of articles being treated in accordance with this invention.

FIG. 2 is an enlarged fragmentary, schematic, vertical sectional view, taken through a portion of the drying station of FIG. 1, and wherein a plurality of positions of the pivotal or rotational drying tube/air knife are illustrated, in both full line and phantom positions, such that the trailing edge of the air knife follows the keeper conveyor, which is the upper conveyor, conforming to various vertical thicknesses of articles being treated between the lower carrying conveyor and the upper keeper conveyor.

DETAILED DESCRIPTION OF THE PREFERRED EMBODIMENTS

Figure 1:
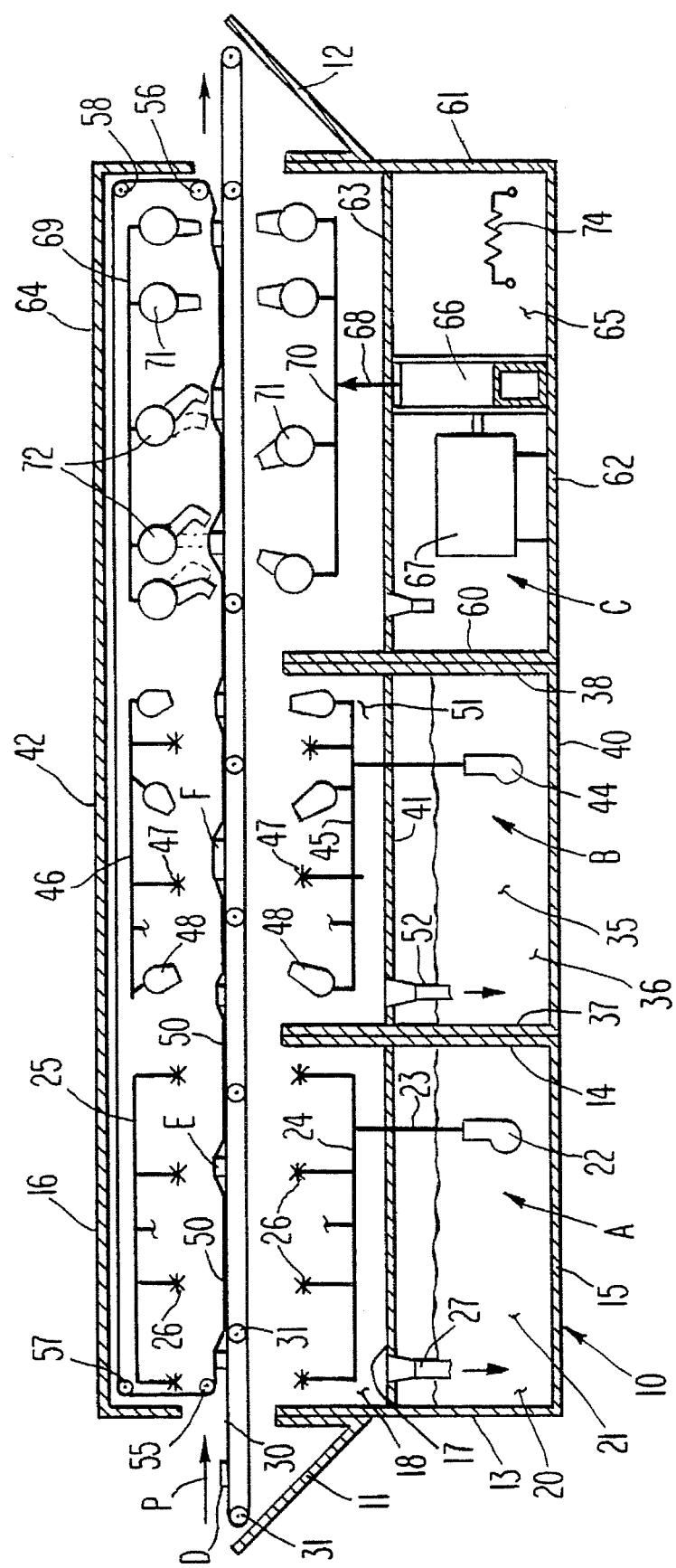

Referring now to the drawings in detail, reference is first made to FIG. 1, wherein the treatment apparatus is generally designated by the numeral 10, as comprising a first treatment zone "A" that may be a wave soldering zone, an etching zone, a cleaning zone or the like, followed by another treatment zone "B", that will generally be a rinsing zone, and then followed by a drying zone generally designated "C".

The apparatus 10 will preferably include an input station 11 and an output station 12, as well.

The treatment station "A", in a situation where it is a cleaning station, (by way of example only) may include forward and rearward walls 13 and 14, a bottom wall 15, a top wall 16 and a separator wall 17, separating an upper zone 18 from a lower liquid collection zone 20.

In such a station "A" typically, a suitable treatment fluid, 21, in zone 20, will be delivered via a pump 22, up through delivery line 23 to manifolds 24, 25, to feed upper and lower spray heads 26, or the like, disposed above and below the path of conveyance of articles through the apparatus, which path is generally designated the by letter "P" as shown for motion of the articles in the direction of the arrow indicated. As articles being delivered through the apparatus are sprayed by treatment fluid through the nozzles, spray heads or the like 26, such fluid may be recirculated via discharge line 27, back into the lower zone 20, for re-use as indicated.

The movement of the articles being treated through the apparatus is by placement of the articles "D", "E", or "F" on the upper run of a preferably foraminous conveyor belt 30 as indicated, with the belt 30 being generally continuous as shown, and being carried by a plurality of suitable rollers 31, as shown.

At least some of the rollers 31 are drive rollers, being driven by a suitable electric motor or the like (not shown), with others of the rollers, as may be desired, being idler rollers.

It will next be noted that in zone "B" of the apparatus, another treatment liquid 35 is carried in a zone 36 at the lower end of the apparatus, which zone 36 is confined by end walls 37 and 38, appropriate side walls (not numbered), a bottom wall 40, and a separation wall 41. A top wall 42 is also generally provided for the apparatus.

Liquid, generally in the form of water, and most often warm water, is carried in zone "B", being pumped therefrom, or from a separate suitable source of rinsing liquid or other treatment fluid, via pump 44, to suitable rinsing liquid discharge headers or manifolds 45, 46, for delivery to suitable spray nozzles 47 or through suitable other liquid discharge members such as floodbars 48, or the like. Liquid, such as warm water or the like, sprayed via the nozzles and floodbars 47, 48, passes through the foraminous upper and lower conveyor belts 50, 30 respectively, to be delivered into zone 51 of apparatus "B" and then preferably to pass from that upper zone, via a discharge duct 52, into the lower zone 36, for re-use as shown.

The upper conveyor belt 50 is also foraminous, such as being comprised of a screen mesh or the like, as is the lower belt 30, with the upper run 50 comprising a keeper conveyor. The purpose of a keeper conveyor is that it is not tightly strung between rollers 55, 56, or in any other manner, but it is somewhat loose, such that its weight can cause it to lie against the upper ends of various articles of different heights or thicknesses, such as those "D", "E", "F" etc. Keeper conveyor 50 is likewise a continuous conveyor belt, being returned around suitable rollers 57, 58 or the like.

With reference now to zone "C" of the apparatus of FIG. 1, it will be seen that the apparatus provided for zone "C" includes end walls 60, 61, bottom wall 62, preferably an upper spacer wall 63, suitable side walls (unnumbered), and a top wall 64. Air from lower zones 65 is drawn via a compressor 66, driven via a motor 67, to deliver pressurized air via lines 68, air manifolds 69, 70, and the like, via suitable ducts, to preferably both stationary air discharge tubes 71 and pivotal air discharge tubes 72.

The stationary air discharge tubes 71 may take on any of various configurations, such, for example, that of those disclosed in U.S. Pat. No. 4,017,982, or the like, or any other form.

Figure 3:
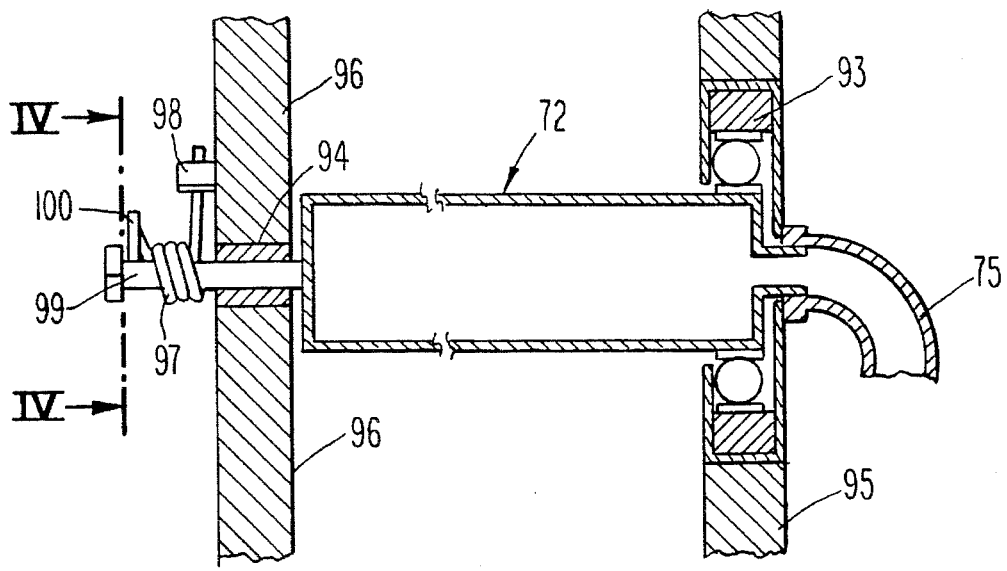
FIG. 3 is an enlarged, transverse sectional view, in schematic format, taken generally along the line III—III of FIG. 2, and wherein the bearing and bushing-mounted air discharge tube and spring biasing is illustrated, representing the manner in which rotation of the tube is facilitated.
Figure 4:
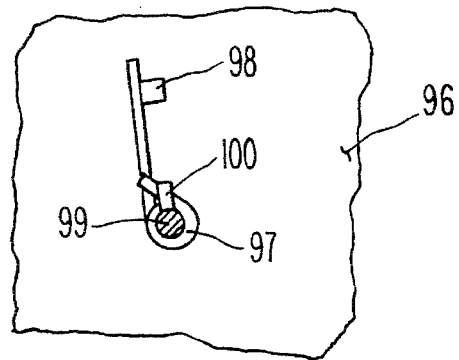
FIG. 4 is an enlarged, fragmentary, schematic left end view of a portion of apparatus of FIG. 3, taken generally along the line IV—IV of FIG. 3, and wherein a spring-type biasing means for facilitating balancing of the rotational movement of the rotatable air discharge tube is illustrated.

The pivotal air discharge tubes may receive air from zones 65, as aforesaid, which may optionally be heated by suitable electric heaters or the like 74, with the air to be delivered via suitable air ducts or the like 75, to a plurality of pivotal, rotationally mounted air discharge tubes or ducts 72, as shown in FIG. 3.

Figure 2:
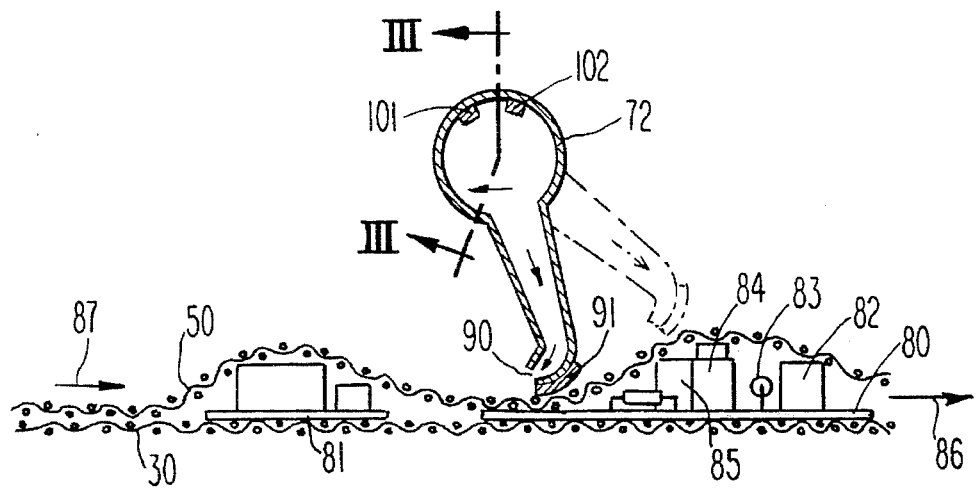

With particular reference to FIG. 2, it will be seen that printed circuit boards 80, 81, with various electronic components mounted thereon, such as at 82, 83, 84 and 85, are carried through the apparatus, in the direction of the arrows 86, 87, between the upper run of the lower conveyor belt 30 and the lower run of the upper keeper conveyor belt 50.

It will be seen that the zone of the discharge opening, or nozzle from which preferably warm air emanates therefrom at 90 will "follow" the keeper conveyor 50, as articles of various thickness pass therebeneath, in that a slide member 91, operates as an anti-friction slide, as the discharge tube 72 pivots, between the full line position therefor shown in FIG. 2, to other positions, such as the phantom position therefor illustrated also in FIG. 2, such that the orientation of the discharge nozzle or air knife changes, to allow air emanating therefrom at 90 to change its direction of impingement upon the printed circuit boards 80, 81 being conveyed therepast, and with the discharge tube 72 pivoting to allow the discharge of air from the tube to accommodate the various thicknesses of printed circuit boards passing therebeneath.

The rotation or pivoting for the discharge tubes 72 is preferably facilitated by means of a roller or ball bearing mounting 93 provided as shown at the right end of FIG. 3, with the left-most mounting as shown in FIG. 3, being an anti-friction bushing mount, as shown at 94. The bearing 93 and bushing 94 are mounted in suitable side walls 95, 96 as shown.

While, as aforesaid, the balancing for the air discharge tube may be effected by means of its weight as is determined by its construction, to offset the thrust of discharge of air via the opening 90, such balancing may also be facilitated by means of a torsion or other spring 97, suitably mounted between a fixed member 98 on the side plate 95 and a pivotal or rotational mount 100 carried on the shaft 99 of the rotating discharge tube, as desired. Alternatively, or in addition thereto, counterweights 101, 102 may be provided at any of various locations, inside or outside the tubes 72, as are desired, as shown in FIG. 2.

It will be apparent from the foregoing that various modifications may be made in the details of construction, as well as in the use and operation of the device in accordance with the present invention. The pivotal mounting provided for the discharge tube may be used for discharge of air or other fluids, such as liquids, either heated or not, and either with or without other treatments, such as cleaning, liquid processing or the like. Also, where warm air is desired, the heating may be provided either via electrical heater means 74, or may be generated by the operation of the equipment itself, 67, 66, which delivers air to the discharge tubes. It will also be apparent that the means of mounting of the conveyor belts 50, 30, are for purposes of illustration only, and are not to be deemed as limiting. Additionally, the details of mounting of the bearing and bushing for the discharge tubes 73 may likewise take on various forms.

It will be further understood that while the use of the rotational mounting for the air discharge tubes is preferably for purposes of facilitating the cleaning of components, and most preferably for the cleaning of printed circuit boards with electronic components mounted thereon, the apparatus and method of this invention may be utilized for treatment of other articles as well, including but not limited to the drying of such other articles. Thus, various modifications may be made in the details of construction, as well as in use an operation of the apparatus and method of the present invention, all within the spirit and scope of the invention as defined in the appended claims.

We claim:

1. Apparatus for treating printed circuit boards having zones of varying thickness, comprising:

a) a first generally foraminous, generally horizontally disposed conveyor means for engaging the lower surfaces of boards placed thereon, for horizontally moving the boards through the treatment apparatus;

b) a second foraminous, generally horizontally disposed conveyor means for engaging upper surfaces of the boards;

c) means for moving the first and second conveyor means and thereby conveying the boards in a generally horizontal direction through the treatment apparatus;

d) with at least one of the conveyor means including means conforming it to different vertical thicknesses of zones of the boards;

e) means for treating the boards with at least one treatment liquid as they are conveyed through the treatment apparatus;

f) means for drying the boards after the boards are treated with a treatment apparatus; said means for drying including:

i) means delivering warm air to at least one warm air discharge tube in the apparatus;

ii) means discharging the warm air through a discharge opening in the air discharge tube as the boards are carried past the discharge opening of the air discharge tube;

iii) follower means whereby the discharge tube follows the conveyor means as it conforms to different vertical thicknesses of zones of boards and with the discharge opening of the discharge tube likewise substantially conforming to different vertical thicknesses of boards; and iv) means enabling a pivotal rotating of the discharge tube to automatically rotate amounts responsive to different vertical thicknesses of zones of boards as conformed to by the opening of the discharge tube.

2. The apparatus of claim 1, wherein the means for treating the boards includes at least means for liquid rinsing the boards.

3. The apparatus of claim 1, including means substantially balancing the pivotal moment caused by the off-center weight of the pivotal discharge tube against the pivotal moment provided by the off-center thrust of warm air from the opening of the discharge tube.

4. The apparatus of claim 3, wherein the means for balancing includes means spring-biasing the pivotal discharge tube in a given pivotal direction.

5. The apparatus of claim 3, wherein the means for balancing includes means providing counter-weight(s) biasing the pivotal discharge tube in a given direction.

6. The apparatus of claim 1, wherein the means conforming the at least one of the conveyor means to different vertical thicknesses of boards comprises means conforming the second conveyor means thereto.

7. The apparatus of claim 1, wherein the follower means includes means for sliding the zone of the discharge tube that includes the discharge opening, along the second conveyor means.

8. The apparatus of claim 1, wherein the means for treating the boards includes at least means for liquid rinsing the boards, including means for substantially balancing the pivotal moment caused by the off-center weight of the pivotal discharge tube against the pivotal moment provided by the off-center thrust of warm air from the opening of the discharge tube, wherein the means conforming the at least one of the conveyor means to different vertical thicknesses of boards comprises means conforming the second conveyor means thereto, and wherein the follower means includes means for sliding the zone of the discharge tube that includes the discharge opening, along the second conveyor means.

9. Apparatus for drying items having zones of varying thickness, comprising:

a) a first generally foraminous, generally horizontally disposed conveyor means for engaging the lower surfaces of the items placed thereon, for horizontally moving the items through the drying apparatus;

b) a second foraminous, generally horizontally disposed conveyor means for engaging upper surfaces of the items;

c) means for moving the first and second conveyor means and thereby conveying the items in a generally horizontal direction through the drying apparatus;

d) with at least one of the conveyor means including means conforming it to different vertical thicknesses of zones of the items;

e) means for drying the items in the drying apparatus; said drying comprising:

i) means delivering air to at least one air discharge tube in the apparatus;

ii) means discharging the air through a discharge opening in the air discharge tube as the items are carried past the discharge opening of the air discharge tube;

iii) follower means whereby the discharge tube follows the conveyor means that conforms to different vertical thicknesses of zones of items and with the discharge opening of the discharge tube likewise substantially conforming to different vertical thicknesses of zones of items; and iv) means enabling a pivotal rotating of the discharge tube to automatically rotate amounts responsive to different vertical thicknesses of zones of items as conformed to by the opening of the discharge tube.

10. The apparatus of claim 9, including means substantially balancing the pivotal moment caused by the off-center weight of the pivotal discharge tube against the pivotal moment provided by the off-center thrust of air from the opening of the discharge tube.

11. The apparatus of claim 10, wherein the means for balancing includes means spring-biasing the pivotal discharge tube in a given pivotal direction.

12. The apparatus of claim 10, wherein the means for balancing includes means providing counter-weight(s) biasing the pivotal discharge tube in a given direction.

13. The method of claim 9, wherein the means conforming the at least one of the conveyor means to different vertical thicknesses of items comprises means conforming the second conveyor means thereto.

14. The apparatus of claim 9, wherein the follower means includes means for sliding the zone of the discharge tube that includes the discharge opening, along the second conveyor means.

15. The apparatus of claim 9, including means substantially balancing the pivotal moment caused by the off-center weight of the pivotal discharge tube against the pivotal moment provided by the off-center thrust of air from the opening of the discharge tube, wherein the means conforming the at least one of the conveyor means to different vertical thicknesses of items comprises means conforming the second conveyor means thereto, and wherein the follower means includes sliding the zone of the discharge tube that includes the discharge opening, along the second conveyor means.

16. Apparatus for fluid treating items having zones of varying thickness, comprising:

a) a first generally foraminous, generally horizontally disposed conveyor means for engaging the lower surfaces of the items placed thereon, for horizontally moving the items through the fluid treatment apparatus;

b) a second foraminous, generally horizontally disposed conveyor means for engaging upper surfaces of the items;

c) means for moving the first and second conveyor means and thereby conveying the items in a generally horizontal direction through the fluid treatment apparatus;

d) with at least one of the conveyor means including means conforming it to different vertical thicknesses of zones of the items;

e) means for fluid treating the items in the fluid treatment apparatus; said fluid treating means comprising:

i) means delivering fluid to at least one fluid discharge tube in the apparatus;

ii) means discharging the fluid through a discharge opening in the fluid discharge tube as the items are carried past the discharge opening of the fluid discharge tube;

iii) follower means whereby the discharge tube follows the conveyor means that conforms to different vertical thicknesses of zones of items and with the discharge opening of the discharge tube likewise substantially conforming to different vertical thicknesses of zones of items; and iv) means enabling a pivotal rotating of the discharge tube to automatically rotate amounts responsive to different vertical thicknesses of zones of items as conformed to by the opening of the discharge tube.

* * * * *